(12) United States Patent
Shen et al.

(10) Patent No.: US 9,921,400 B2
(45) Date of Patent: Mar. 20, 2018

(54) SYSTEM AND METHOD FOR MANIPULATING AN OBJECT FOR IMAGING

(71) Applicant: City University of Hong Kong, Kowloon (HK)

(72) Inventors: Yajing Shen, Kowloon (HK); Wenfeng Wan, Kowloon Tong (HK); Lijun Zhang, Hung Hom (HK)

(73) Assignee: City University of Hong Kong, Kowloon (HK)

( * ) Notice: Subject to any disclaimer, the term of this patent is extended or adjusted under 35 U.S.C. 154(b) by 218 days.

(21) Appl. No.: 14/972,318

(22) Filed: Dec. 17, 2015

(65) Prior Publication Data
US 2017/0176733 A1 Jun. 22, 2017

(51) Int. Cl.
*H04N 7/18* (2006.01)
*G02B 21/26* (2006.01)
*H01J 37/20* (2006.01)

(52) U.S. Cl.
CPC .............. *G02B 21/26* (2013.01); *H01J 37/20* (2013.01)

(58) Field of Classification Search
CPC ............ G02B 21/26; H01J 37/20; H04N 7/18
USPC ............................................................ 348/80
See application file for complete search history.

(56) References Cited

U.S. PATENT DOCUMENTS

| 4,833,698 A * | 5/1989 | Flannery | G01N 23/046 378/19 |
| 7,130,375 B1 * | 10/2006 | Yun | G01N 23/04 378/205 |
| 7,400,704 B1 * | 7/2008 | Yun | G01N 23/04 378/205 |
| 2016/0266363 A1 * | 9/2016 | Findlay | G02B 21/26 |
| 2016/0363543 A1 * | 12/2016 | Georgeson | G01N 22/02 |

* cited by examiner

*Primary Examiner* — Francis G Geroleo
(74) *Attorney, Agent, or Firm* — Renner Kenner Greive Bobak Taylor & Weber

(57) ABSTRACT

A method for manipulating an object for imaging by an imaging device includes the steps of rotating the object about a rotation axis into a plurality of angular positions; capturing an image of the object at each of the plurality of angular positions; and determining a respective translation required of the object for the plurality of angular positions, the translation being along a plane substantially orthogonal to the rotation axis; wherein the respective translation is arranged to align the object to the rotation axis so as to maintain the object within a field of view of the imaging device.

27 Claims, 11 Drawing Sheets

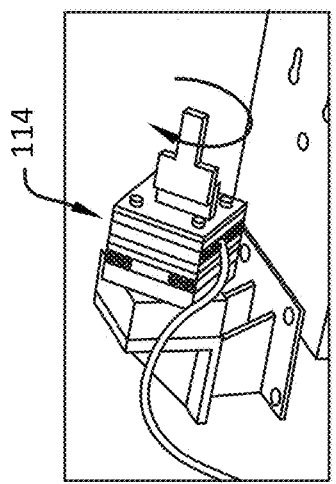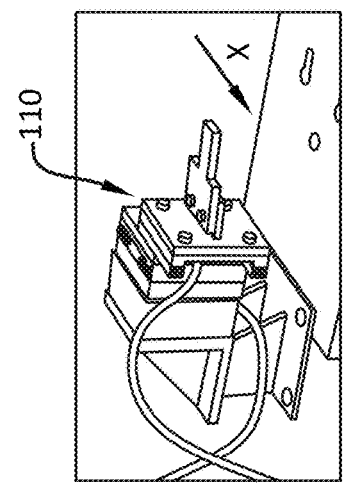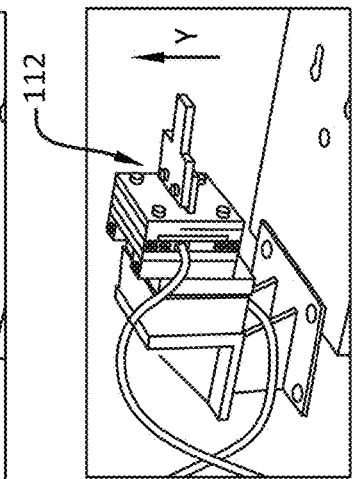
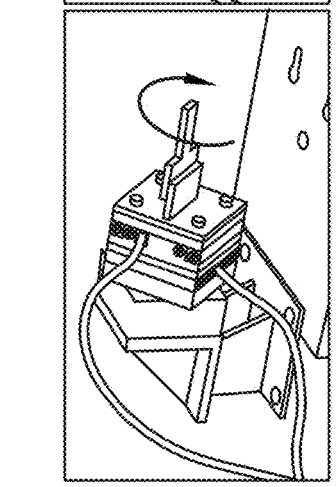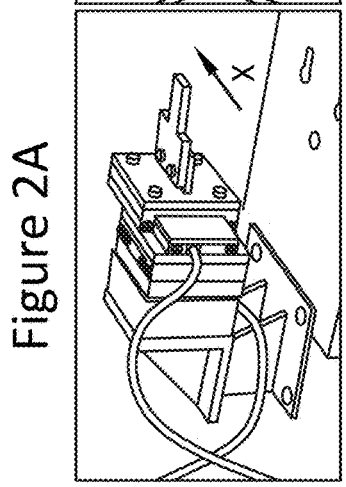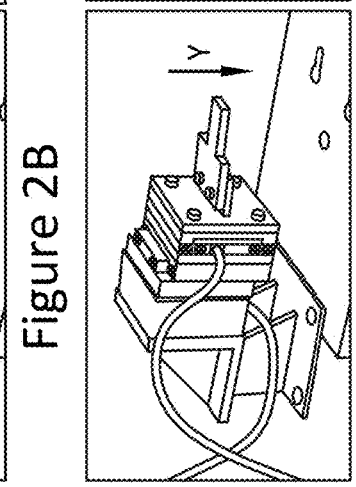
Figure 2A  Figure 2B  Figure 2C
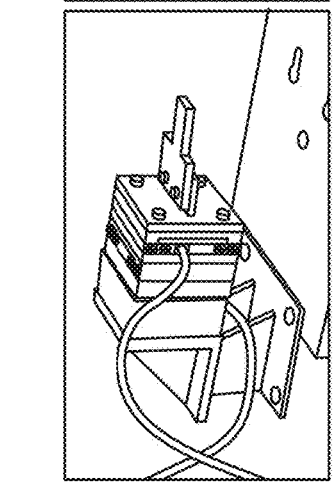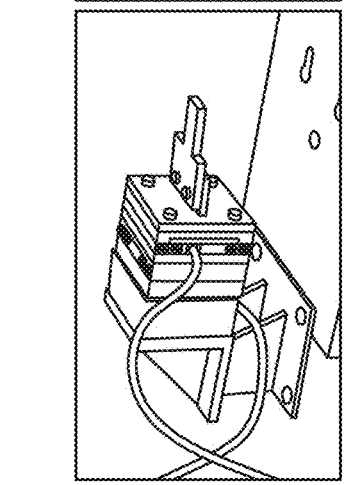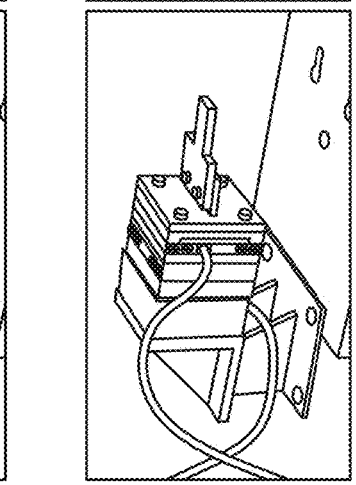

SYSTEM AND METHOD FOR MANIPULATING AN OBJECT FOR IMAGING

TECHNICAL FIELD

The present invention relates to the field of imaging, and particularly, although not exclusively, to a system and method for aligning an object to a field of view of the imaging device for imaging an object being rotated at different angular positions.

BACKGROUND

Imaging of objects with high magnification and large view area at small scale is desirable in many applications, such as micro defect detection, precise manipulation, and in-situ material characterization. Microscopic imaging techniques are one of the suitable techniques for these applications. This is because microscopic imaging apparatuses can image micro- or nano-sized sample objects with resolution up to nanometer scale, and by moving the sample stage and image the sample object at different positions on the same plane, a large microscopic view area can be obtained.

Despite these advantages, most of the existing microscopy systems can only image from one fixed direction. And as a result, some other surfaces of the sample object are not imaged, which results in loss of information. More importantly, the information obtained from a single surface is usually not complete and hence cannot fully reflect the overall properties of the object.

SUMMARY OF THE INVENTION

In accordance with a first aspect of the present invention, there is provided a method for manipulating an object for imaging by an imaging device, comprising the steps of: rotating the object about a rotation axis into a plurality of angular positions; capturing an image of the object at each of the plurality of angular positions; and determining a respective translation required of the object for the plurality of angular positions, the translation being along a plane substantially orthogonal to the rotation axis; wherein the respective translation is arranged to align the object to the rotation axis so as to maintain the object within a field of view of the imaging device.

In one embodiment of the first aspect, the rotation axis is substantially perpendicular to an imaging axis of the imaging device, and the plane is substantially parallel to the imaging axis of the imaging device.

In one embodiment of the first aspect, the plurality of angular positions comprises a first angular position, a second angular position and a third angular position, wherein an angular separation between the first and second angular positions is the same as an angular separation between the second and third angular positions.

In one embodiment of the first aspect, the step of determining the translation required of the object at each of the plurality of angular positions in step (c) comprises: mapping a position of the object in an object space to a position of the object on the image in an image space; and determining the translation required of the object in the object space based on a position difference of the object in the images in the image space.

In one embodiment of the first aspect, the position of the object in the object space $[x_N, y_N, z_N]^T$ is mapped to the position of the object on the image in the image space $[x_M, y_M, z_M]^T$ based on:

$$\begin{bmatrix} x_M \\ y_M \\ z_M \end{bmatrix} = \frac{1}{u} RX(\theta_y) \cdot RY(\theta_y) \cdot RZ(\theta_y) \begin{bmatrix} x_N \\ y_N \\ z_N \end{bmatrix} + T_{MN}$$

wherein $$T_{MN} \infty \begin{bmatrix} x_T \\ y_T \\ z_T \end{bmatrix}, RX(\theta_x) = \begin{bmatrix} 1 & 0 & 0 \\ 0 & \cos\theta_x & \sin\theta_x \\ 0 & -\sin\theta_x & \cos\theta_x \end{bmatrix},$$

$$RY(\theta_y) = \begin{bmatrix} \cos\theta_y & 0 & -\sin\theta_y \\ 0 & 1 & 0 \\ \sin\theta_y & 0 & \cos\theta_y \end{bmatrix}, RZ(\theta_z) = \begin{bmatrix} \cos\theta_z & \sin\theta_z & 0 \\ -\sin\theta_z & \cos\theta_z & 0 \\ 0 & 0 & 1 \end{bmatrix},$$

$\theta_x$, $\theta_y$ and $\theta_z$ are a rotation angle of the object space relative to the image space about rotation axes $X_M$, $Y_M$ and $Z_M$ in the image space respectively; $[x_T, y_T, z_T]^T$ is a translation between the object space and the image space, and u is a dimension of a pixel in the image.

In one embodiment of the first aspect, the position of the object in the object space is a position of a target point of the object in object space.

In one embodiment of the first aspect, the method further comprises the step of selecting the target point of the object in an object space using a Canny edge detection algorithm.

In one embodiment of the first aspect, the translation required of the object for a particular angular separation is determined based on:

$$\begin{bmatrix} x_{n0} \\ y_{n0} \\ z_{n0} \end{bmatrix} = u \begin{bmatrix} \dfrac{\Delta x_f + \Delta x_b}{2\cos\alpha - 2} \\ \dfrac{\Delta x_f - \Delta x_b}{2\sin\alpha} \\ \dfrac{1}{u} z_{n0} \end{bmatrix}$$

wherein $[x_{n_0}, y_{n_0}, z_{n_0}]^T$ is a coordinate of a to-be-aligned point of the object in object space; u is a dimension of a pixel in the image space, $\Delta x_f$ is a position difference of the object in the image of the first angular position and in the image of the second angular position; $\Delta x_b$ is a position difference of the object in the image of the second angular position and the object in the image of the third angular position; and $\alpha$ is an angular separation between the first and second angular positions or an angular separation between the second and third angular positions.

In one embodiment of the first aspect, the method further comprises the step of: comparing the position difference with an error threshold $\epsilon_{mag}$ to determine if translation determined would be sufficient to move the object into an optimized position.

In one embodiment of the first aspect, the error threshold $\epsilon_{mag}$ is defined by $$\varepsilon_{mag} = \frac{u}{Ra} TP$$

wherein u is a dimension of a pixel in the image space; Ra is an indicator of a fluctuation tolerance of the object in the field of view of the imaging device; and TP is a height of the image measured in the image space.

In one embodiment of the first aspect, upon determining that the position difference is larger than the error threshold $\epsilon_{mag}$: translating the object to a new position based on the determined translation; and repeating steps (a) to (c) for the same angular separation with the object translated to the new position.

In one embodiment of the first aspect, upon determining that the position difference is smaller than the error threshold $\epsilon_{mag}$: repeating steps (a) to (c) for one or more further angular separations.

In one embodiment of the first aspect, the angular separation is smaller than the one or more further angular separations, and the one or more further angular separations. Preferably, the further angular separations are arranged in an ascending order, i.e., the angular separations increases from one to another.

In one embodiment of the first aspect, the angular separation and the one or more further angular separations are each less than 90 degrees. Optionally, the angular separation and the one or more further angular separations may be larger than or equal to 90 degrees.

In one embodiment of the first aspect, the method further comprises adjusting a magnification of the imaging device to a second value after repeating steps (a) to (c) for the one or more further angular separations.

In one embodiment of the first aspect, the second value of the magnification equals to a working magnification of the imaging device.

In one embodiment of the first aspect, the method further comprises adjusting a magnification of the imaging device to a first value prior to step (a).

In one embodiment of the first aspect, the first value is smaller than a working magnification of the imaging device.

In one embodiment of the first aspect, the method further comprises the step of imaging the object at the optimized positions by rotating and translating the object based on the determined translation at the plurality of angular positions.

In one embodiment of the first aspect, the object is rotated about the rotation axis in step (d) for at least one revolution so as to obtain a plurality of images of the object at different angular positions.

In one embodiment of the first aspect, the object is rotated continuously about the rotation axis in step (d).

In one embodiment of the first aspect, the translation and rotation of the object are independent.

In one embodiment of the first aspect, the imaging of the object in step (d) is performed under a working magnification of the imaging device.

In one embodiment of the first aspect, the object includes one or more micro- or nano-structures to be imaged by the imaging device.

In one embodiment of the first aspect, the method further comprises the step of measuring rotational properties of the object as the object is being rotated and translated based on the determined translation at each of the different angular positions. For example, the rotational properties may include torque and rotation stiffness of the object.

In one embodiment of the first aspect, the imaging device is an optical microscope or an electron microscope.

In one embodiment of the first aspect, the method is substantially automated.

In accordance with a second aspect of the present invention, there is provided a system for manipulating an object for imaging by an imaging device, comprising a translation and rotation assembly arranged to rotate the object about a rotation axis and to translate the object along a plane substantially orthogonal to the rotation axis; a controller arranged to control the translation and rotation assembly and to control operation of an imaging device; wherein the controller is arranged to operate the translation and rotation assembly and the imaging device to perform the method in accordance with the first aspect of the present invention.

In one embodiment of the second aspect, the rotation axis is substantially perpendicular to an imaging axis of the imaging device, and the plane is substantially parallel to the imaging axis of the imaging device.

In one embodiment of the second aspect, the imaging device is an optical microscope or an electron microscope.

In one embodiment of the second aspect, the translation and rotation assembly has three or more degree of freedom.

In one embodiment of the second aspect, the translation and rotation assembly comprises a translation module and a rotation module that can be operated independently.

It is an object of the present invention to address the above needs, to overcome or substantially ameliorate the above disadvantages or, more generally, to provide a system and method for aligning an object to a field of view of the imaging device for imaging an object being rotated at different angular positions. It is also an object of the present invention to provide a rotation alignment system that enables automatic full-orientation (e.g., 360 degrees) imaging.

BRIEF DESCRIPTION OF THE DRAWINGS

Embodiments of the present invention will now be described, by way of example, with reference to the accompanying drawings in which:

FIG. 2A is a picture showing a rotation movement of the robot of FIG. 1;

FIG. 2B is a picture showing a horizontal translation movement of the robot of FIG. 1;

FIG. 2C is a picture showing a vertical translation movement of the robot of FIG. 1;

DETAILED DESCRIPTION OF THE PREFERRED EMBODIMENT

Figure 1:
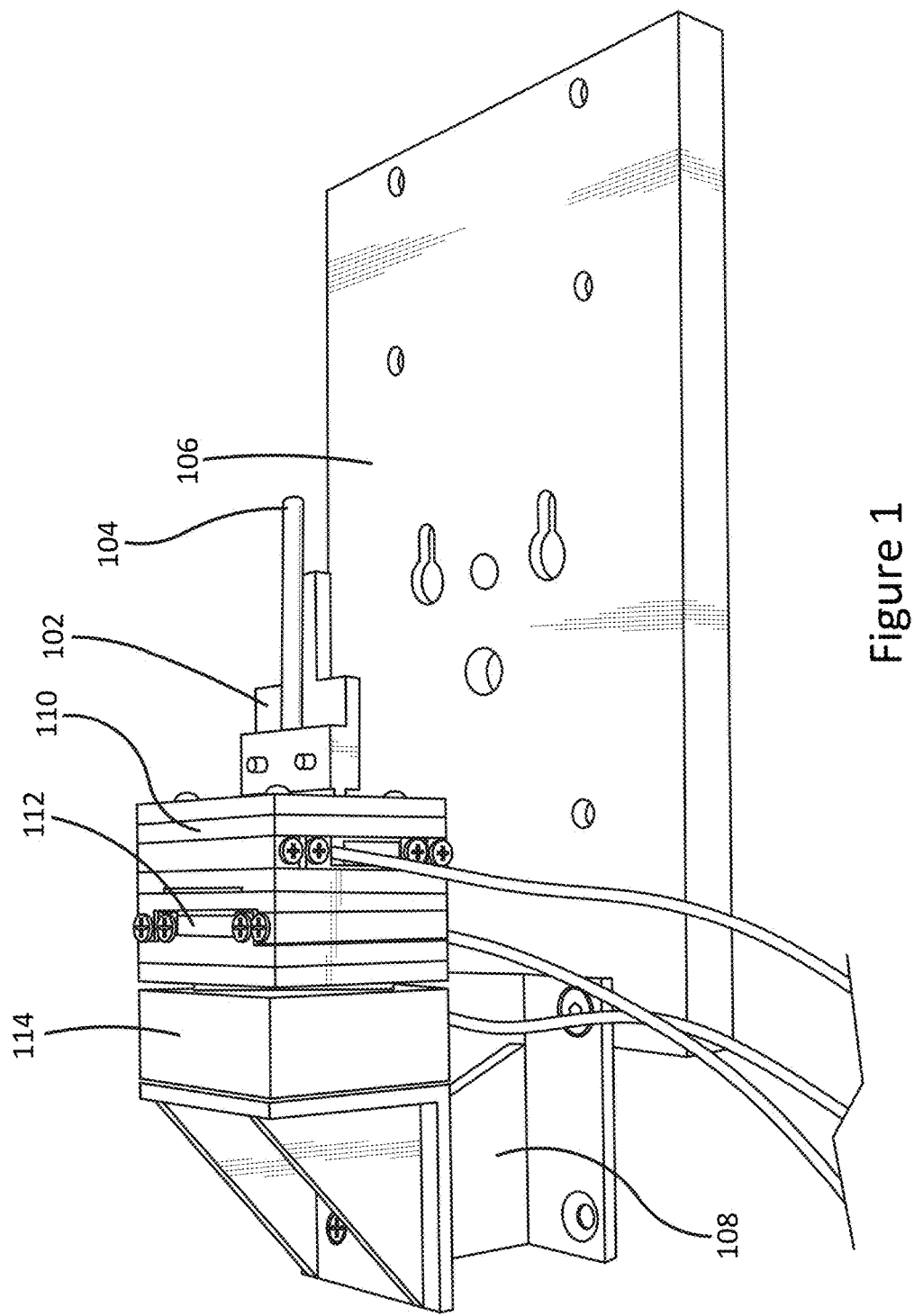
FIG. 1 is picture of a rotation alignment robot in accordance with one embodiment of the present invention.

Referring to FIG. 1, there is provided a rotation alignment robot 100 in accordance with one embodiment of the present invention. As shown in FIG. 1, the robot 100 includes a rotation and translation assembly connected with a stage 102 for holding a sample object 104. The rotation and translation assembly is connected to a base holder 106 through a supporting arm 108. The rotation and translation assembly includes a first linear positioner 110, a second linear positioner 112 and a rotary positioner 114. In one example, the linear positioners 110, 112 and the rotary positioner 114 are positioners of Model ECS3030 from Attocube Inc. In the present embodiment, the sample stage 102 is mounted to the first linear positioner 110, the first linear positioner 110 is mounted to the second linear positioner 112, and the second linear positioner 112 is mounted to the rotary positioner 114. Preferably, the movement directions of the first and second linear positioners 110, 112 are mutually perpendicular and independent. The first and second linear positioners 110, 112 is arranged to translate the sample object 104 (more specifically, a point of the sample object 104) along a plane substantially orthogonal to a rotation axis of the rotary positioner 114. In the present embodiment, the robot 100 includes three degree of freedom, with two mutually perpendicular translational degrees of freedom and one rotary degree of freedom.

Preferably, the robot 100 also includes a controller (not shown) that controls the translation and rotation assembly to align the object to the rotation axis during imaging so as to maintain the object within a field of view of a microscope. In one embodiment, the controller also controls the operation of the microscope. The robot 100 in the present embodiment is adapted to co-operate with a microscope, in particular, an optical microscope or an electron microscope. When used with the microscope, the robot 100 is preferably oriented such that the rotation axis of the rotary positioner 114 is substantially perpendicular to an imaging axis of the microscope, and the plane is substantially parallel to the imaging axis of the microscope.

In other embodiments, instead of having two linear positioners, the robot may include only one translation module that translates the object along the plane. Also, in alterative constructions, the robot may include further translation modules and/or rotation modules such that the degree of freedom of the robot is more than three. The microscope used in the present embodiment may be an optical or an electron microscope. In other embodiments, other imaging device that is not a microscope may also be used.

FIGS. 2A-2C illustrate translation and rotary movements of the robot 100 of FIG. 1 in accordance with one embodiment of the present invention. In FIG. 2A, the rotary positioner 114 of the robot 100 is arranged to rotate about a rotation axis. Preferably, the rotary positioner 114 is arranged to rotate the first and second linear positioners 110, 112 as it rotates. In FIG. 2B, the first linear positioner 110 is arranged to translate and hence move the sample object along a linear, horizontal, direction X. In FIG. 2C, the second linear positioner 112 is arranged to translate and hence move the sample object along a linear, vertical, direction Y. Preferably, the first linear positioner 110 is arranged to be moved along the vertical direction Y together with the second linear positioner 112 as the second linear positioner 112 moves.

In the present embodiment, the translation and rotary movements in FIGS. 2A-2C are preferably independent of each other. In one embodiment, the movement and rotation speed of the robot 100 in FIGS. 2A-2C is controlled by varying an input pulse frequency. In one example, the travel range, resolution and repeatability for the first and second linear positioners 110, 112 are 20 mm, 1 nm and 50 nm respectively, and the travel range, resolution and repeatability for the rotary positioner 114 are 360° endless, 1 μ° and 5% over full range respectively. Considering that the limiting resolution of an optical microscope in some examples is approximate 200 nm, the robot in the above example can meet the resolution requirement in microscopic imaging.

Figure 3:
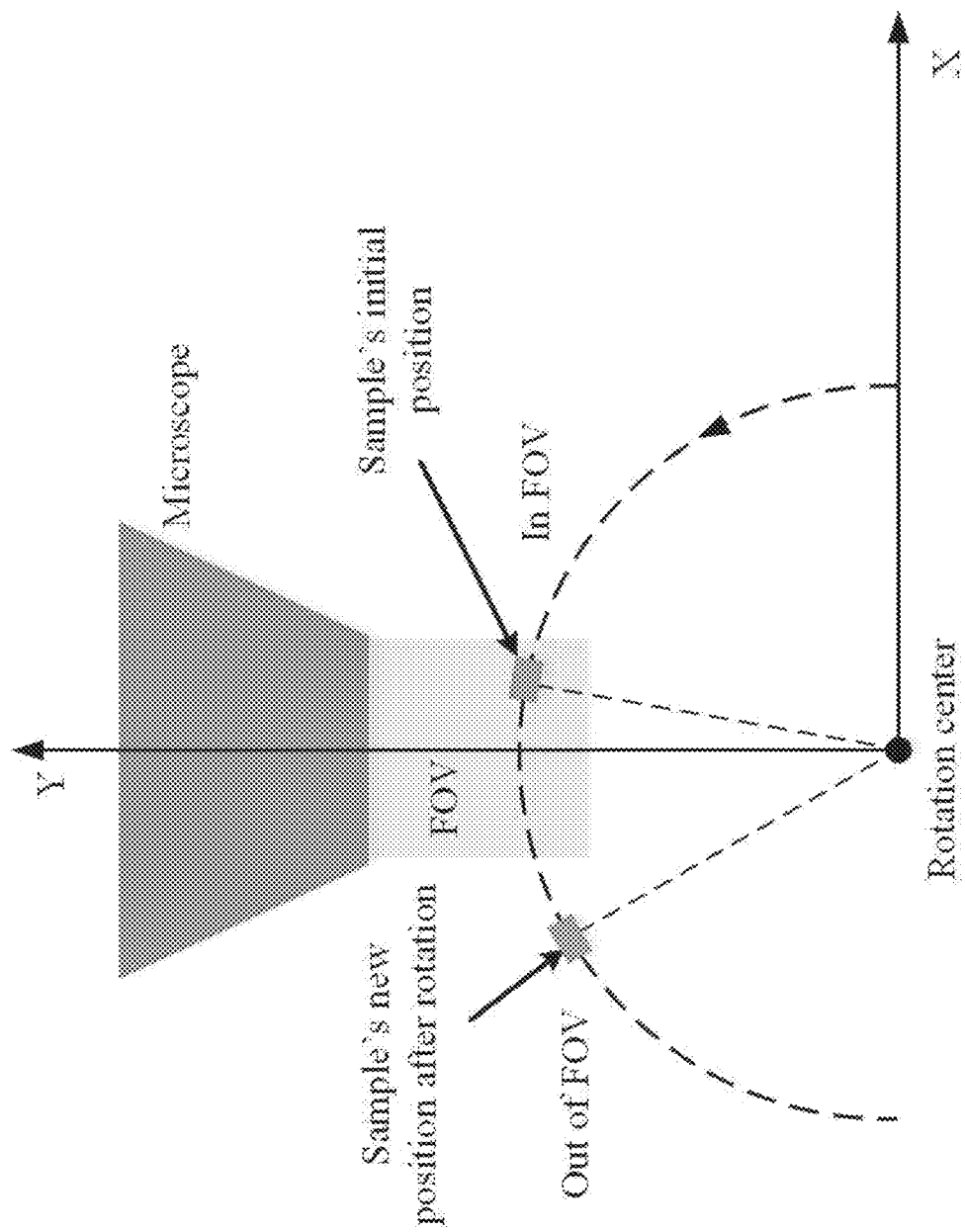
FIG. 3 is a plot illustrating a movement trajectory of the object to be imaged during rotation, with the object traveling out of the field of view of the microscope.

The inventors of the present invention have devised, through experiments and trials, that in order to achieve full-orientation imaging using microscopes, the sample object should be rotated for at least 360°. However, one serious problem with rotating the sample object for at least 360° is that the sample may move out of the field of view (FOV) of the microscope if the sample is not located on the rotation axis, as illustrated in FIG. 3. The inventors of the present invention recognised that the alignment of the sample object is crucial achieve full-orientation imaging using microscopes, but is aware of the fact that microscopes can only provide a 2D image and it is very difficult to determine directly an exact position of the sample object by microscopic observation. Thus, the inventors of the present invention has proposed the following alignment strategy for aligning the sample object within the field of view of the microscope based on information obtaining from three microscopic images so as to allow full-orientation imaging of the object using microscopes. In the following, this strategy is referred to as "triple-image alignment (TIA)".

I. Alignment Principle

Figure 4A:
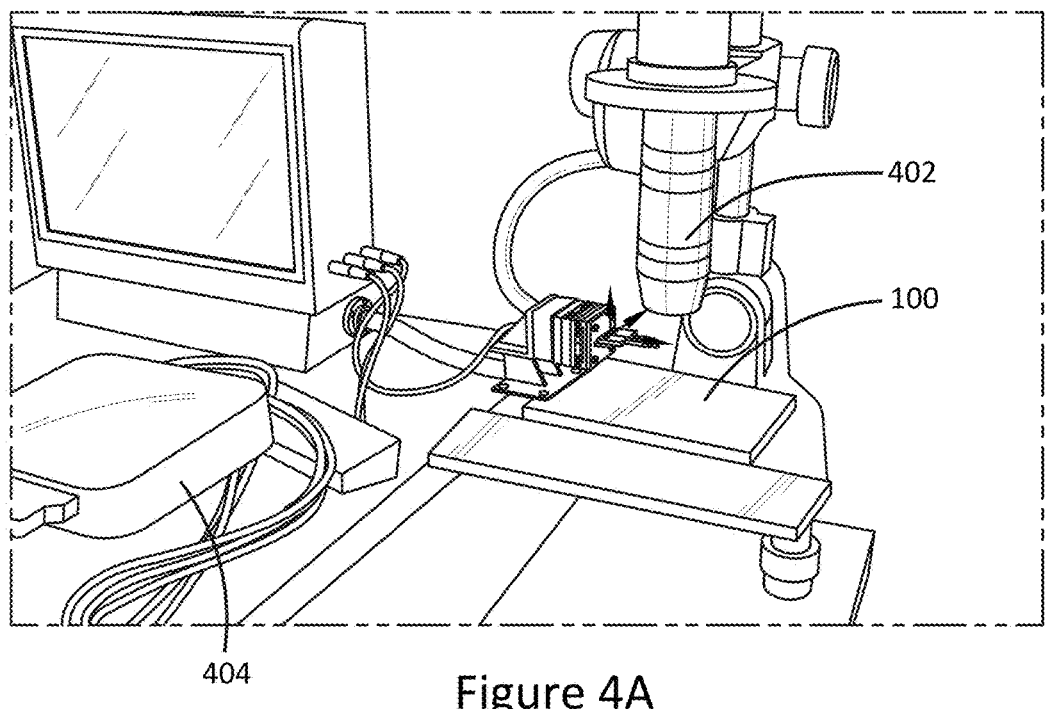
FIG. 4A is a picture showing an experimental set-up of the rotation alignment robot of FIG. 1 with a microscope in accordance with one embodiment of the present invention.

FIG. 4A shows an experimental set-up of the rotation alignment robot 100 of FIG. 1 with a microscope 402 in accordance with one embodiment of the present invention. As shown in FIG. 4A, the robot 100 is arranged on a platform of the microscope 402. The robot 100 and the microscope 402 are connected with a controller 404, which is in turn connected to an image processing system (e.g., computer).

Figure 4B:
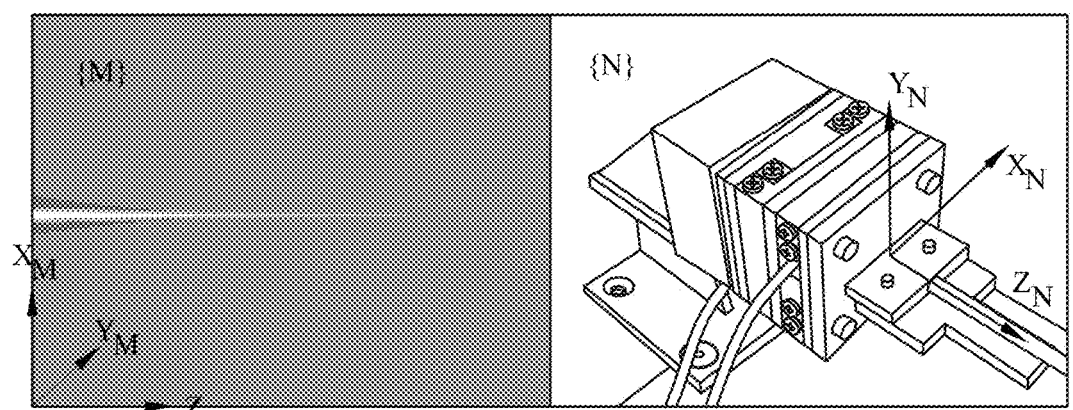
FIG. 4B is a picture illustrating an object space of the object and an image space of an image of the object in the set-up of FIG. 4A.

As shown in FIGS. 4A and 4B, two coordinate systems, {M} and {N}, are established to illustrate the alignment principle. The microscope image coordinate {M} (i.e., in the image space) is established on an imaging space of the microscope 402, with the origin being at the lower left corner of the microscopic images. $X_M$ and $Z_M$ are axes that extend along the short and long sides of the images respectively, and $Y_M$ is an axis that extends parallel to an imaging axis of the microscope 402, such as an optical axis of an optical microscope. The robot coordinate {N} (i.e., in the object space) is established on the robot 100, with the origin located at the rotation axis on an outer surface of the first linear positioner 110. $X_N$ and $Y_N$ are axes that extend parallel to linear moving directions of the first and second linear positioners 110, 112 respectively. As the rotary positioner 114 rotates about the $Z_n$ axis, the $X_N$ and $Y_N$ axes would also rotate.

Supposing a point on the sample object has coordinate $(x_N, y_N, z_N)$ in {N} and the same point has a coordinate $(x_M, y_M, z_M)$ in {M}, the two coordinates can be mapped with each other based on the following equation, $$\begin{bmatrix} x_M \\ y_M \\ z_M \end{bmatrix} = \frac{1}{u} RX(\theta_x) \cdot RY(\theta_y) \cdot RZ(\theta_z) \begin{bmatrix} x_N \\ y_N \\ z_N \end{bmatrix} + T_{MN} \quad (1)$$

In (1), $$T_{MN} = \begin{bmatrix} x_T \\ y_T \\ z_T \end{bmatrix} \quad (2)$$

$$RX(\theta_x) = \begin{bmatrix} 1 & 0 & 0 \\ 0 & \cos\theta_x & \sin\theta_x \\ 0 & -\sin\theta_x & \cos\theta_x \end{bmatrix} \quad (3)$$

$$RY(\theta_y) = \begin{bmatrix} \cos\theta_y & 0 & -\sin\theta_y \\ 0 & 1 & 0 \\ \sin\theta_y & 0 & \cos\theta_y \end{bmatrix} \quad (4)$$

$$RZ(\theta_z) = \begin{bmatrix} \cos\theta_z & \sin\theta_z & 0 \\ -\sin\theta_z & \cos\theta_z & 0 \\ 0 & 0 & 1 \end{bmatrix} \quad (5)$$

where $\theta_x$, $\theta_y$ and $\theta_z$ is the rotation angle of {N} relative to {M} about axis $X_M$, $Y_M$ and $Z_M$ respectively; $(x_T, y_T, z_T)^T$ is the translational part between the two coordinate systems {N} and {M}; and u is the represented physical distance (μm) of each pixel in the microscopic image.

Figure 5B:
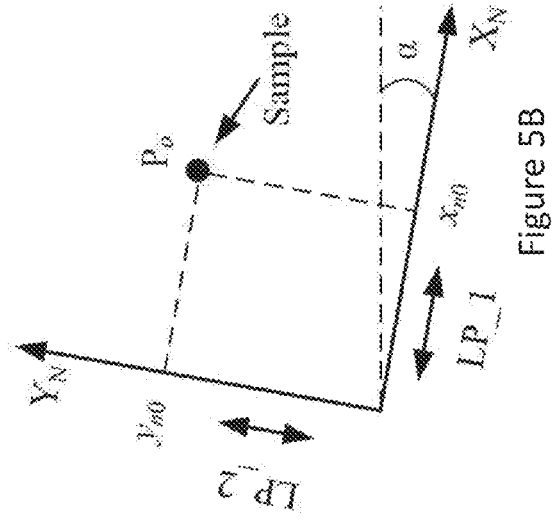
FIG. 5B is a graph showing a position of point P of the object in the object space after being rotated clockwise by α degree.
Figure 5D:
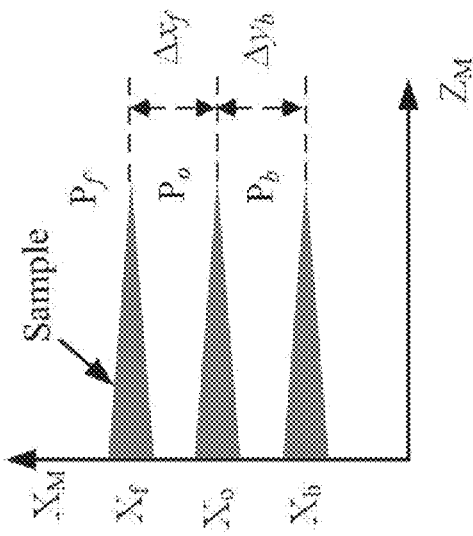
FIG. 5D is a graph showing the corresponding positions of point P in the image space for the position of point P of the object in the object space in FIGS. 5A-5C.
Figure 5A:
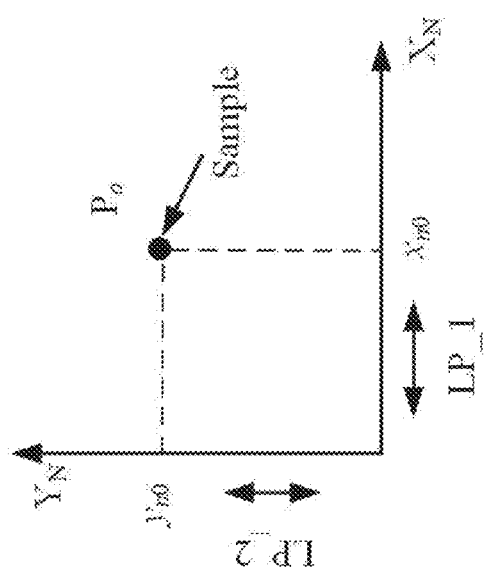
FIG. 5A is a graph showing an initial position of point P of the object in the object space before rotation.
Figure 5C:
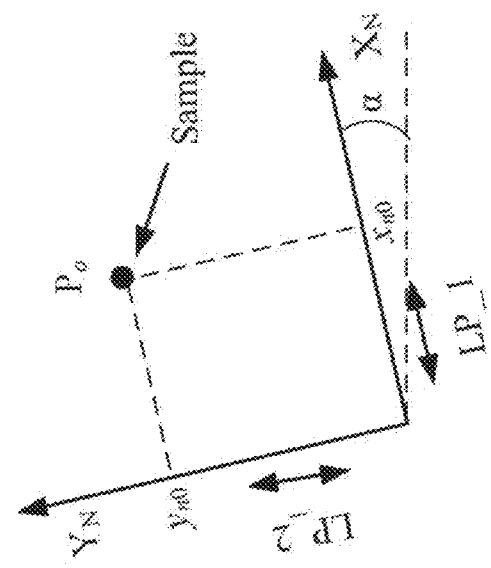
FIG. 5C is a graph showing a position of point P of the object in the object space after being rotated anti-clockwise by α degrees.

FIGS. 5A-5D illustrate a movement of a point P in coordinates {N} and {M} when the object is rotated. Point P is preferably a to-be-aligned point taken from a point of the object. As shown in FIG. 5A, point P on the object has an initial coordinate of $(x_{n_0}, y_{n_0}, z_{n_0})$ in {N}. As the rotary positioner is rotated by an angle of α in clockwise and anticlockwise manner respectively (as shown in FIGS. 5B and 5C), the coordinate of point P in {M} before rotation $(x_o, y_o, z_o)^T$, the coordinate of point P after being rotated clockwise (or forward) by α degrees $(x_f, y_f, z_f)^T$ and the coordinate of point P after being rotated anti-clockwise (or backward) by α degrees $(x_b, y_b, z_b)^T$ can be expressed by the following equations (6), (7) and (8):

$$\begin{bmatrix} x_o \\ y_o \\ z_o \end{bmatrix} = \frac{1}{u} RX(\theta_{x0}) \cdot RY(\theta_{y0}) \cdot RZ(\theta_{z0}) \begin{bmatrix} x_{n0} \\ y_{n0} \\ z_{n0} \end{bmatrix} + T_{MN} \quad (6)$$

$$\begin{bmatrix} x_f \\ y_f \\ z_f \end{bmatrix} = \frac{1}{u} RX(\theta_{x0}) \cdot RY(\theta_{y0}) \cdot RZ(\theta_{s0} + \alpha) \begin{bmatrix} x_{n0} \\ y_{n0} \\ z_{n0} \end{bmatrix} + T_{MN} \quad (7)$$

$$\begin{bmatrix} x_b \\ y_b \\ z_b \end{bmatrix} = \frac{1}{u} RX(\theta_{x0}) \cdot RY(\theta_{y0}) \cdot RZ(\theta_{s0} + \alpha) \begin{bmatrix} x_{n0} \\ y_{n0} \\ z_{n0} \end{bmatrix} + T_{MN} \quad (8)$$

where $\theta_{x_0}$, $\theta_{y_0}$, $\theta_{z_0}$ represent the initial rotation angle of {N} relative to {M} about $X_M$-axis, $Y_M$-axis, $Z_M$-axis respectively.

Next, define $\Delta x_f$ and $\Delta x_b$, which represent the position shift of point P on the microscope images after the rotary positioner has been rotated by α degrees clockwise and anticlockwise, respectively, $$\begin{bmatrix} \Delta x_f \\ \Delta y_f \\ \Delta z_f \end{bmatrix} = \begin{bmatrix} x_f - x_o \\ y_f - y_o \\ z_f - z_o \end{bmatrix} = \quad (9)$$

$$\frac{1}{u} RX(\theta_{x0}) \cdot RY(\theta_{y0}) \cdot [RZ(\theta_{s0} + \alpha) - RZ(\theta_{s0})] \begin{bmatrix} x_{n0} \\ y_{n0} \\ z_{n0} \end{bmatrix}$$

$$\begin{bmatrix} \Delta x_b \\ \Delta y_b \\ \Delta z_b \end{bmatrix} = \begin{bmatrix} x_b - x_o \\ y_b - y_o \\ z_b - z_o \end{bmatrix} = \quad (10)$$

$$\frac{1}{u} RX(\theta_{x0}) \cdot RY(\theta_{y0}) \cdot [RZ(\theta_{z0} + \alpha) - RZ(\theta_{s0})] \begin{bmatrix} x_{n0} \\ y_{n0} \\ z_{n0} \end{bmatrix}$$

In practice, $\theta_{x_0}$, $\theta_{y_0}$ and $\theta_{z_0}$ can be reduced to zero by adjusting the position and orientation of the robot. In particular, $\theta_{x_0}$ can be reduced to zero by arranging the bottom plane of the holder of the robot to be parallel to the image plane. $\theta_{y_0}$ can be reduced to zero by arranging the two perpendicular edges of the holder of the robot to be parallel to the two perpendicular sides of the image plane respectively. $\theta_{z_0}$ can be reduced to zero by rotating the rotary positioner so that $X_M$-axis is parallel to $X_N$-axis. By making these adjustments, equations (9) and (10) can be represented as:

$$\begin{bmatrix} \Delta x_f \\ \Delta y_f \\ \Delta z_f \end{bmatrix} = \frac{1}{u}[RZ(\alpha) - RZ(0)] \begin{bmatrix} x_{n0} \\ y_{n0} \\ z_{n0} \end{bmatrix} \quad (11)$$

$$= \frac{1}{u} \begin{bmatrix} \cos\alpha - 1 & \sin\alpha & 0 \\ -\sin\alpha & \cos\alpha - 1 & 0 \\ 0 & 0 & 0 \end{bmatrix} \begin{bmatrix} x_{n0} \\ y_{n0} \\ z_{n0} \end{bmatrix}$$

$$\begin{bmatrix} \Delta x_b \\ \Delta y_b \\ \Delta z_b \end{bmatrix} = \frac{1}{u}[RZ(-\alpha) - RZ(0)] \begin{bmatrix} x_{n0} \\ y_{n0} \\ z_{n0} \end{bmatrix} \quad (12)$$

$$= \frac{1}{u} \begin{bmatrix} \cos\alpha - 1 & -\sin\alpha & 0 \\ \sin\alpha & \cos\alpha - 1 & 0 \\ 0 & 0 & 0 \end{bmatrix} \begin{bmatrix} x_{n0} \\ y_{n0} \\ z_{n0} \end{bmatrix}$$

By solving the above two equations (11) and (12), the coordinate of the to-be-aligned point P $(x_{n_0}, y_{n_0}, z_{n_0})$ in {N} can be expressed as $$\begin{bmatrix} x_{n0} \\ y_{n0} \\ z_{n0} \end{bmatrix} = u \begin{bmatrix} \dfrac{\Delta x_f + \Delta x_b}{2\cos\alpha - 2} \\ \dfrac{\Delta x_f - \Delta x_b}{2\sin\alpha} \\ \dfrac{1}{u} z_{n0} \end{bmatrix} \quad (13)$$

In equation (13), $\Delta x_f$ and $\Delta x_b$ can be measured from the microscopic image using image processing methods; u (μm/pixel) represents the dimension of each pixel, and can be calculated based on the magnification of the microscope. As a result, the coordinate of point P ($x_{n_0}$, $y_{n_0}$) in {N} can be calculated by subtitling these parameters into equation (13).

Using this TIA method embodiment, the robot 100 can align the sample object to the rotation axis of rotary positioner 114 by moving the first linear positioner 110 by $-x_{n_0}$, and the second linear positioner 112 by $-y_{n_0}$.

II. Vision-based Control System

Figure 6:
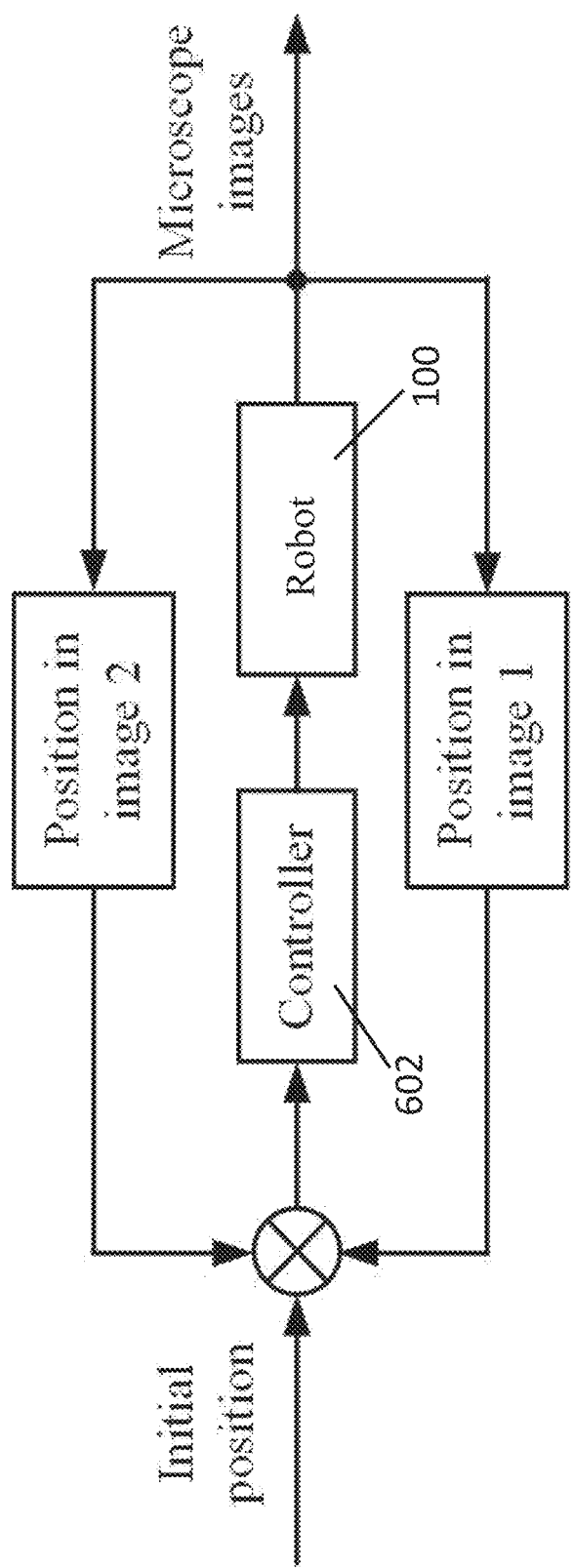
FIG. 6 is a block diagram showing a control of an automatic alignment of the object in one embodiment of the present invention.

FIG. 6 is a block diagram showing a control of an automatic alignment of the object in one embodiment of the present invention. In the present embodiment, the alignment is based on microscopic images obtained at three different angular positions using a microscope operably associated with the robot 100. The position of the to-be aligned point on the sample object is obtained by image processing methods, and is used as a feedback signal to control the alignment. As shown in FIG. 6, a controller 602 in connection with the robot 100 is arranged to process the three images obtained at three different angular positions based on the above alignment algorithm, and to automatically determine a proper alignment required of the positioners and hence the sample object.

Figures 7A, 7B:
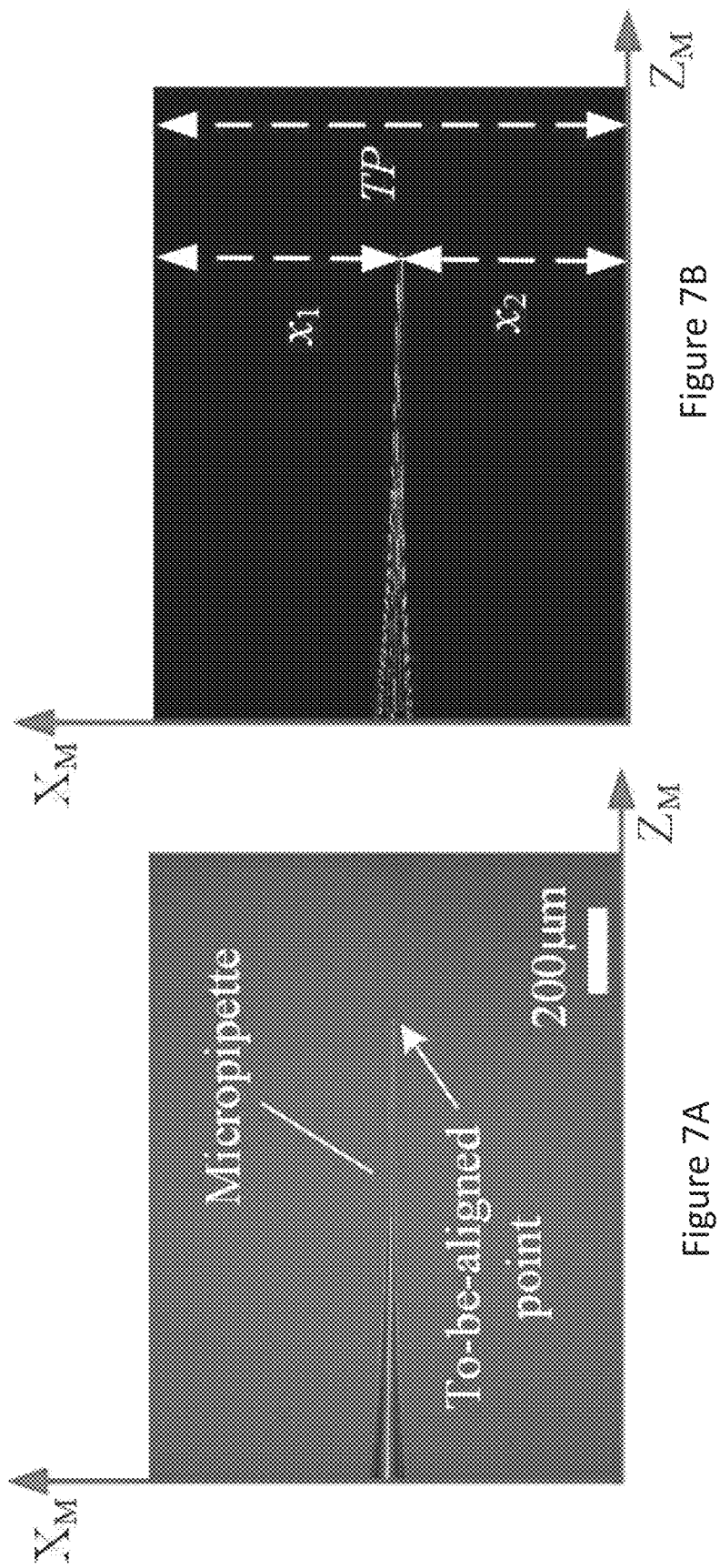
FIG. 7A is an exemplary microscope image of a glass micropipette.
FIG. 7B is a processed image of FIG. 7A, illustrating object detection using Canny edge detection algorithm.

For demonstration, in the present embodiment, a micropipette is used as a sample object, and the tip of the micropipette is selected to be the to-be-aligned point, as shown in FIGS. 7A-7B. In one embodiment, the microscopic image in FIG. 7A is processed by Canny edge detection. FIG. 7B shows the processed microscopic image. As shown in FIG. 7B, $x_1$ is computed by detecting pixel values from top of the image to bottom of the image, and $x_2$ is computed by detecting pixel values from bottom of the image to up of the image. The coordinate of the tip in {M} can be calculated by $$x_{tip} = \dfrac{TP - x_1 - x_2}{2} + x_2 \quad (14)$$

where TP, $x_1$, $x_2$, represent height of the image, distance between an upper edge of the tip and an upper edge of the image, and distance between a bottom edge of the tip and a bottom edge of the image respectively.

Based on equation (14), the coordinate of the to-be-aligned point in {M} before rotating ($x_o$), after rotating clockwise ($x_f$) and after rotating anticlockwise ($x_b$) can be determined. By substituting these values into equations (9) and (10), the value of $\Delta x_f$ and $\Delta x_b$ can be calculated. After that, the relative position between rotation axis and the sample object, i.e., ($x_{n_0}$, $y_{n_0}$), can be determined by substituting $\Delta x_f$ and $\Delta x_b$ into equation (13). Lastly, the control system would move the first linear positioner by $-x_{n_0}$ and the second linear positioner by $-y_{n_0}$ to align the sample to the rotation axis automatically.

In the experiment of the present embodiment, a simple switching controller may be used to control the movement of the robot. Also the robot itself may have an optoelectronic sensing feedback for improving accuracy.

III. Alignment Strategy with Three Loops

Figure 8:
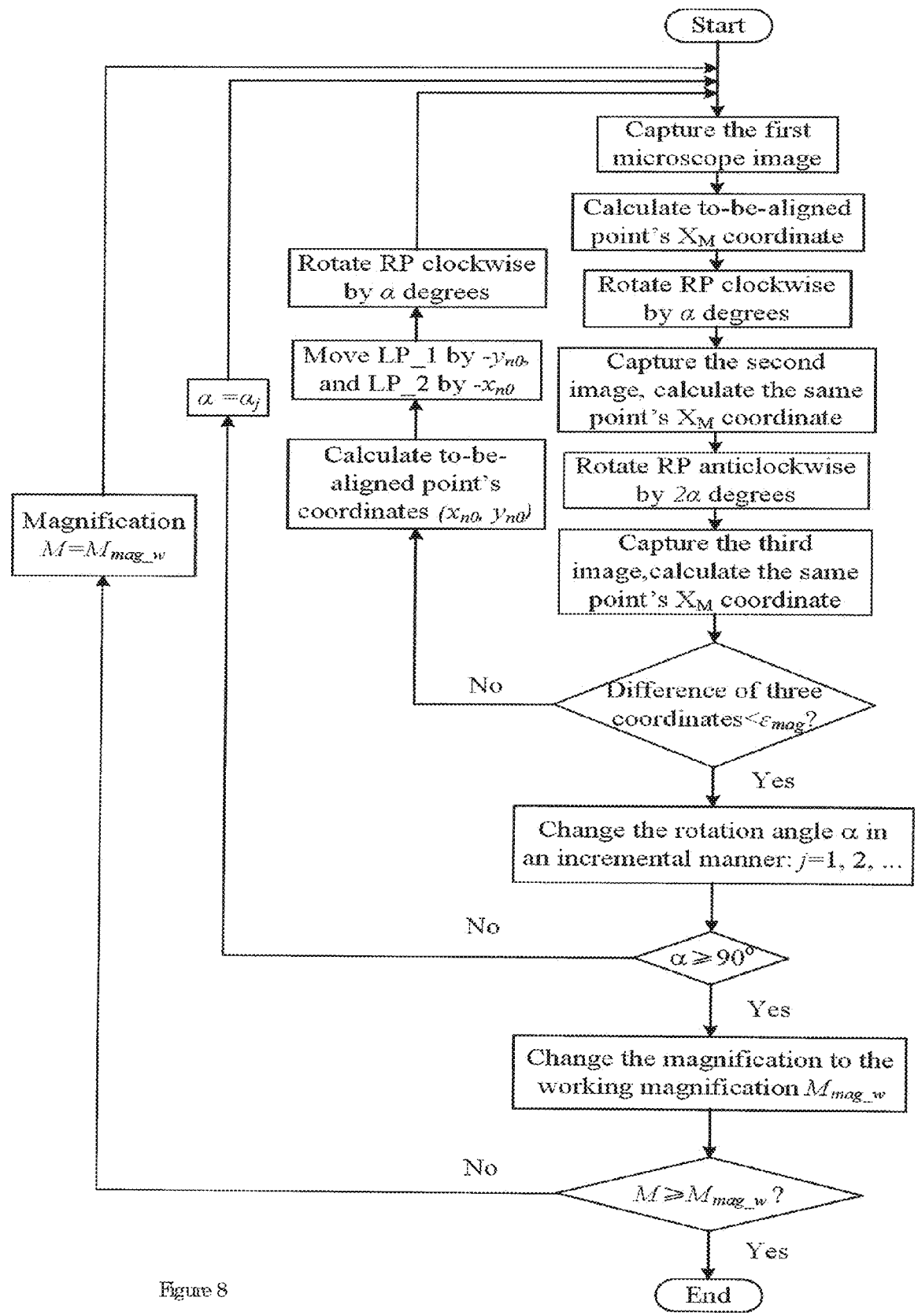
FIG. 8 is a block diagram showing an alignment algorithm for aligning the object for imaging.

Although the sample object can be considered aligned to the rotation axis after one iteration of the TIA process, the TIA process may be repeated so as to further improve accuracy and eliminate measurement errors. FIG. 8 a three-loop alignment strategy based on the above TIA process in one embodiment of the present invention. The strategy of FIG. 8 can be implemented in the robot 100 of FIG. 1, or other control systems.

Referring to FIG. 8, there is provided a method for manipulating an object for imaging by an imaging device, comprising the steps of: rotating the object about a rotation axis into a plurality of angular positions; capturing an image of the object at each of the plurality of angular positions; and determining a respective translation required of the object for the plurality of angular positions, the translation being along a plane substantially orthogonal to the rotation axis; wherein the respective translation is arranged to align the object to the rotation axis so as to maintain the object within a field of view of the imaging device.

The three-loop alignment strategy in the embodiment of FIG. 8 includes a position shift loop (innermost loop), an angle loop (middle loop) and a magnification loop (outermost loop).

In the position shift loop, the sample object is aligned by the TIA process, and the position shift for aligning the sample object is evaluated by comparing with an error threshold. More particularly, the position shift loop includes the step of capturing an initial microscopic image of the sample and calculate a $X_M$ coordinate $x_o$ in {M} for the to-be-aligned point P. Then, the rotary positioner is rotated clockwise by an angle of α degree. The second microscopic image is then captured and a $X_M$ coordinate $x_f$ of point P is calculated. Next, the rotary positioner is rotated in the opposite direction by an angle of 2α degree. The second microscopic image is then captured and a $X_M$ coordinate $x_b$ of point P is calculated. The differences $\Delta x_f$ and $\Delta x_b$ between the three $X_M$ coordinates are then calculated based on the equations in the previously illustrated embodiment of the TIA process. Finally, the coordinates ($x_{n_0}$, $y_{n_0}$) of the sample object can be calculated according to equation (13), and the first linear positioner is moved by $-x_{n_0}$ and the second linear positioner is moved by $-y_{n_0}$. The rotary then returns to the original angular position by rotating clockwise by an angle of α degree.

The operation steps in the position shift loop may be different in other embodiments but still within the scope of the present invention. For example, the rotary positioner can be rotated in any order to obtain three images at different angular positions. Also, the calculation of the coordinates $x_o$, $x_f$, $x_b$ need not be performed each time after capturing an image, but can be performed after two or more of the images are captured.

In the angle loop, the sample is further aligned using a series of different incremental rotation angles: $\alpha_1, \alpha_2, \ldots, \alpha_j$ ($\alpha_1 < \alpha_2 < \ldots < \alpha_j$, j=1,2, . . . ). Preferably, none of the rotation angles is larger than 90°. In order words, the angle loop is arranged to repeat the position shift loop with different rotation angles (angular separation between two angular positions) of increasing magnitudes. To prevent the sample object from being moved out of the field of view of the microscope, a small rotation angle $\alpha_1$ is chosen initially. After that, one or more gradually increasing rotation angles $\alpha_j$ is chosen to improve the alignment accuracy, as a larger α (α<90°) would result in larger $\Delta x_f$ and $\Delta x_b$ in equations (9)

and (10). In this situation, the error measured from $\Delta x_f$ and $\Delta x_b$ would become smaller, and the alignment accuracy can be increased.

In the magnification loop, the sample object is aligned at the working magnification ($M_{mag\_w}$) for the sample observation, if the initial magnification of the microscope is less than $M_{mag\_w}$. More particularly, to further increase the positioning accuracy, the TIA alignment process would be repeated with $\alpha=90°$ at $M_{mag\_w}$, as a larger microscope magnification would lead to a higher resolution in the calculation of the to-be-aligned point's position in $\{M\}$.

The embodiment of the three-loop alignment process in FIG. 8 can be summarized by the following steps. First, the magnification of the microscope is adjusted to be $M_1$. The algorithm conducts alignment with alignment angle $\alpha_1$ until the position shift is acceptable for maintaining the sample object within a field of view of the microscope. Upon completion of the alignment process with angle $\alpha 1$, the algorithm then repeats the alignment process with a series of incremental alignment angle $\alpha_j$ ($\alpha_1 < \alpha_j$) until $\alpha$ reaches 90°. Finally, the algorithm adjusts the microscope's magnification to $M_{mag\_w}$, and repeats the alignment process with $\alpha=90°$.

IV. Experiments and Results

An experiment has been performed to verify the performance of the alignment strategy in the embodiment of FIG. 8 and its related alignment system. In one embodiment, the alignment system is the system shown in FIG. 1 or 4. In the experiment, a glass micropipette with a tip diameter 10 μm is used as the sample object and the center of the tip of the micropipette is taken as the to-be-aligned point.

In the experiment, the initial magnification $M_1$ for the alignment is set to $M_1=200$ in the position shift loop and the angle loop. In the angle loop, the increment angle $\alpha$ is set as $\alpha_1=15°$, $\alpha_2=45°$, and $\alpha_3=90°$ respectively. In the magnification loop, the working magnification $M_{mag\_w}$ of the microscope for observing the sample object is set to $M_{mag\_w}=1000$. The error threshold $\epsilon_{mag}$ is an adjustable value corresponding to the magnification of the microscope, and is defined as:

$$\epsilon_{mag} = \frac{u}{Ra} TP \quad (15)$$

where u (μm/pixel) represents the physical distance of each pixel; TP is the height of microcopy image (unit pixel) measured in $\{M\}$; and Ra (Ra>1) is a ratio value used to describe a fluctuation tolerance of the sample in the FOV of the microscope (a higher Ra indicates a lower fluctuation). As u is changing at different magnification, the error threshold $\epsilon_{mag}$ can be adjusted based on the magnification.

In the experiment, Ra is set to 40. This would mean that if the position shift of the sample object in the image space is less than $\epsilon_{mag}$, the fluctuation range of the sample should be less than 1/40 of the height of the microscopic image. In this case, the sample object can be ensured to be remained in the FOV of the microscope during rotation of the rotary positioner and hence the object. The error thresholds in the experiment are $\epsilon_{mag\_200}=30.9$ μm and $\epsilon_{mag\_1000}=6.41$ μm for magnification $M_1=200$ and $M_{mag\_w}=1000$, respectively, and they are calculated based on microscopy image analysis. In other examples, a higher Ra can be chosen to achieve a higher alignment accuracy.

To estimate the alignment quality, the maximum position shift S between the three images is defined as, $$S = u \cdot [\text{Max}(x_{P(0)}, x_{P(\alpha)}, x_{P(-\alpha)}) - \text{Min}(x_{P(0)}, x_{P(\alpha)}, x_{P(-\alpha)})] \quad (16)$$

where $x_{P(0)}$, $x_{P(\alpha)}$, $x_{P(-\alpha)}$ are the $X_M$ coordinates of the to-be-aligned point at rotation angle 0°, $\alpha$, and $-\alpha$ degrees.

Figure 9A:
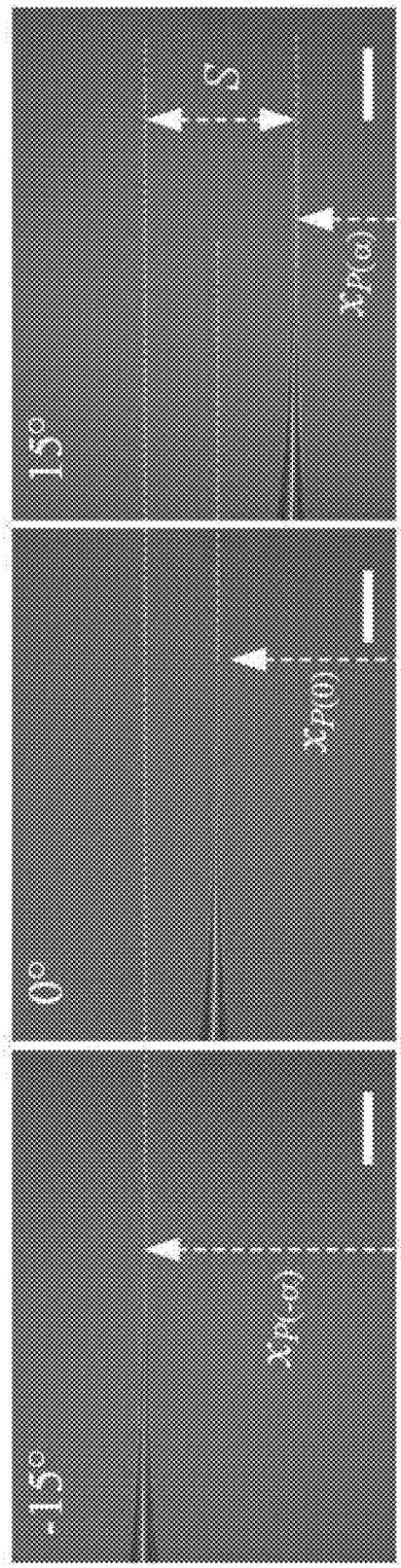
FIG. 9A is a series of microscopic images of a micropipette at rotation angle −15°, 0° and 15° before alignment.

First, the alignment process is implemented with $\alpha_1=15°$ at magnification $M_1=200$. FIG. 9A shows the three initial images before alignment at rotation angle $-15°$, 0° and 15°. As shown in Table I, at the initial condition, S equals to 484 μm which is larger than the error threshold $\epsilon_{mag\_200}=30.9$ μm. As a result, the alignment process is performed automatically. The coordinate $(x_{n0}, y_{n0})$ of the tip of the micropipette in $\{N\}$ is calculated by equation (13), and is calculated to be:

$$(x_{n0}, y_{n0}) = (-288, 935) \text{μm} \quad (17)$$

Upon determining the coordinate $(x_{n0}, y_{n0})$, the algorithm causes the first linear positioner to move $-935$ μm and the second linear positioner to move 288 μm to align the sample object to the rotation axis of the robot.

Figure 9B:
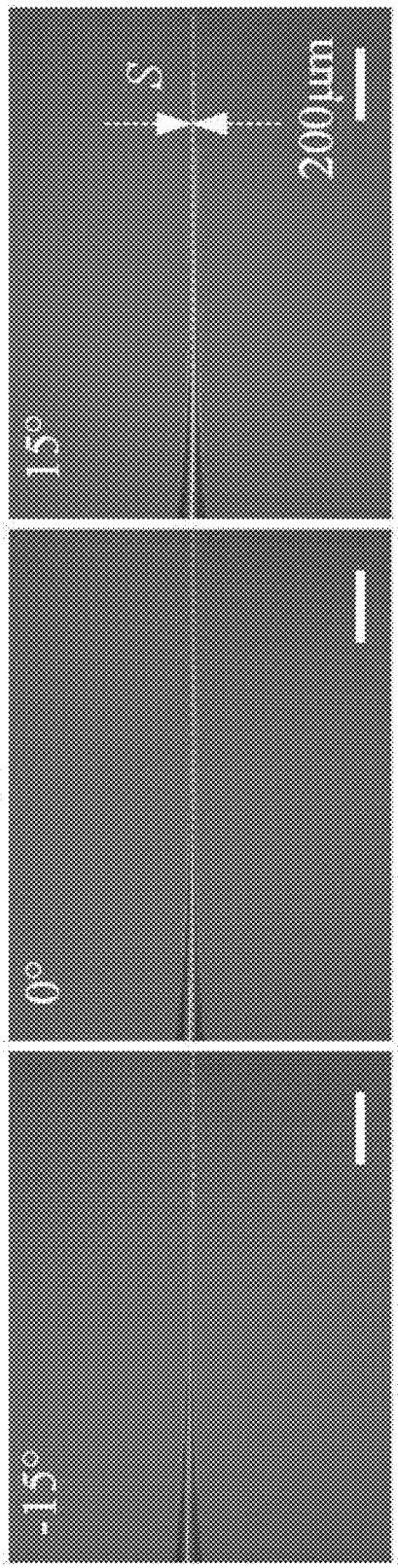
FIG. 9B is a series of microscopic images of a micropipette at rotation angle −15°, 0° and 15° after alignment.

Afterwards, the images of the micropipette are checked again at $-15°$, 0° and 15°, as shown in FIG. 9 (b). This time, S equals to 17 μm, which is smaller than the error threshold 30.9 μm. This means that the alignment with magnification $M_1=200$ and alignment angle $\alpha_1=15°$ is completed.

Table I illustrates the detailed measurements before and after alignment at differ alignment angles. The result indicates the position shift between the three images S can be decreased from 484 μm to 17 μm (~96.5%) after the first alignment loop, the position shift loop.

TABLE I

POSITION BETWEEN THREE IMAGES (S) BEFORE ALIGNMENT AND AFTER ALIGNMENT WITH ALIGNMENT ANGLE 15°

| Alignment angle | Before alignment | | After alignment | |
|---|---|---|---|---|
| | u · $x_p$ (μm) | S (μm) | u · $x_p$ (μm) | S (μm) |
| $-15°$ | 804 | | 648 | |
| 0° | 571 | 484 | 638 | 17 |
| 15° | 320 | | 631 | |

Next, in the angle loop, the alignment is implemented at the same magnification $M_1=200$ as before. In this example, three different angles, i.e. $\alpha_1=15°$, $\alpha_2=45°$, and $\alpha_3=90°$ are used for three different alignments, and the micropipette tip's shift S of the tip of the micropipette in each step is determined to be less than $\epsilon_{mag\_200}=30.9$ μm, as listed in Table II.

After the first alignment step with $\alpha_1=15°$, the shift of the tip has been reduced from the initial value of 484 μm to 17 μm. However, after rotating $\alpha_2=45°$, a shift of 49 μm still exists. Then, after the alignment with $\alpha_1=45°$, the shift of the tip is reduced to 5 μm. However, for angle $\alpha_3=90°$, there still exists a shift of 112 μm. And after the alignment with $\alpha_3=90°$, the shift of the tip is reduced to 11 μm.

TABLE II

POSITION SHIFT BETWEEN THREE IMAGES (S) FOR DIFFERENT ALIGNMENT ANGLE

| | S (μm) | |
|---|---|---|
| Alignment angle | Before | After |
| 15° | 484 (initial value) | 17 |
| 45° | 49 | 5 |
| 90° | 112 | 11 |

These results in Table II indicate a larger shift S can be obtained from microscopy as the sample is rotated for a larger angle. According to the principle illustrated in FIG. 5, the coordinate is calculated mainly based on two parameters $\Delta x_f$ and $\Delta x_b$ from the microscopic images, and when the rotation angle increases from 0° to 90°, the two values also increases in most situations. Thus, when calculating $(x_{n_0}, y_{n_0})$ by substituting $\Delta x_f$ and $\Delta x_b$ into equation (13), the computational accuracy should also be increased. This shows that a higher alignment accuracy can be obtained by changing the rotation angle in an increment manner in the angle loop.

As the ultimate goal of the alignment is to observe the sample object from full-orientation (i.e., different angular positions) by rotating the sample object, in the magnification loop, the magnification of the microscope is changed to the working magnification $M_{mag\_w}=1000$. In this condition, the sample would have a greater chance to be rotated out of the FOV of the microscope due to the enlargement of the sample image resulting from the increased magnification. Therefore, using equation (15), a new error threshold $\epsilon_{mag\_1000}=6.4$ μm is used to estimate the alignment effectiveness. As shown in Table III, the shift is 11 μm after the alignment at $M_1=200$, and this is larger than $\epsilon_{mag\_1000}$. Thus, the alignment should be repeated automatically at $M_{mag\_w}=1000$.

In the magnification loop, only α=90° is chosen because the to-be-aligned point has already been aligned closed to rotation axis after the alignment at $M_1=200$. Therefore, for this loop, there is no need to re-start the alignment process from the small alignment angle to prevent the sample from moving out of Field of View microscope. Table III shows that the position shift can be reduced from 11 μm to 6.1 μm, a reduction of around 45%, after this magnification alignment loop.

TABLE III

POSITION SHIFT BETWEEN THREE IMAGES (S) FOR DIFFERENT MAGNIFICATION

| | S (μm) | |
|---|---|---|
| Magnification | Before | After |
| 200× | 112 | 11 |
| 1000× | 11.3 | 6.1 |

The above experiment has not only verified the operation of the alignment strategy for high magnification, but also demonstrated the efficiency of the three loop alignment strategy in the embodiment of FIG. 8.

During the alignment process, the maximum position shift of the object point in the three images S is used as a parameter to compare with the error threshold. The advantage of this arrangement lies in that the position shift can be estimated easily and quickly, which is crucial factors for achieving high alignment efficiency. However, the position shift may still not fully reflect the alignment quality in one revolution (360°).

To more accurately assess the alignment quality, after the alignment is completed, the robot rotates the sample object with one complete revolution (360°), and an microscopic image of the sample object is captured for every 30 degrees rotation. Two parameters have been defined to estimate the alignment quality for 360° based on the 12 images obtained. The two parameters are the maximum position shift $S_{M360}$ and position standard deviation $S_{DM360}$: where X[i] (i=1, 2, ..., 12) is the position of the to-be-aligned point in {M} for the 12 images, illustrated in equations (19) and (20)

$$S_{M360} = u \cdot [\text{Max}(x_P[12]) - \text{Min}(x_P[12])] \quad (19)$$

$$SD_{M360} = u \cdot \sqrt{\frac{1}{11} \sum_{i=1}^{12} \left( x_P[i] - \frac{\sum_{i=1}^{12} x_P[i]}{12} \right)^2} \quad (20)$$

The parameter $S_{M360}$ indicates the maximum difference among these images in one revolution (360°), and it is used to estimate the maximum movement range of the sample in the FOV of the microscope. If $S_{M360}$ is smaller than the height of the microscopic image, the sample could remain in the FOV during the rotation. The parameter $S_{DM360}$ indicates the standard deviation of the coordinate of the to-be-aligned point, and it is used to estimate the disturbance of sample object during the rotation in one revolution. If $S_{DM360}$ is small, the sample would have small fluctuation during the rotation. In short, a smaller $S_{M360}$ and $S_{DM360}$ indicate a better alignment result.

Figure 10A:
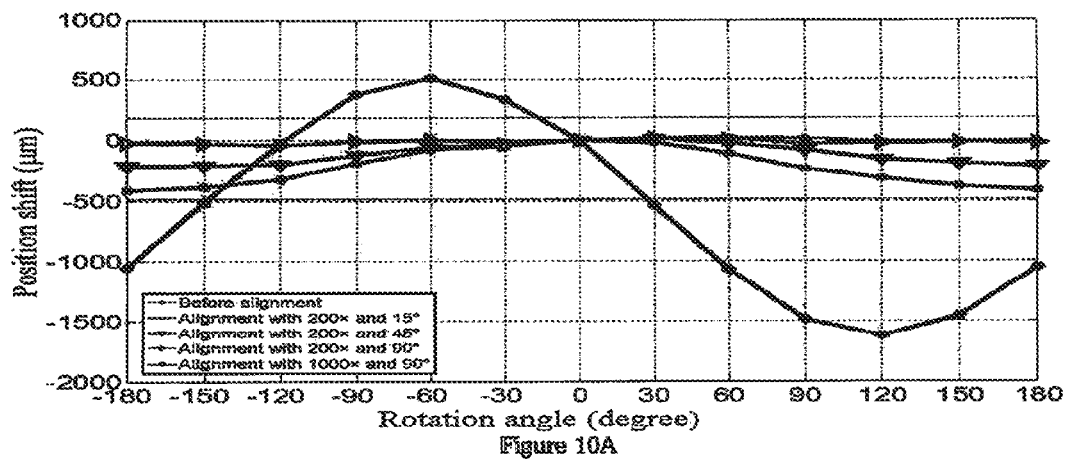
FIG. 10A is a graph showing a position shift of a tip of the micropipette in each alignment step in one complete automatic alignment process.
Figure 10B:
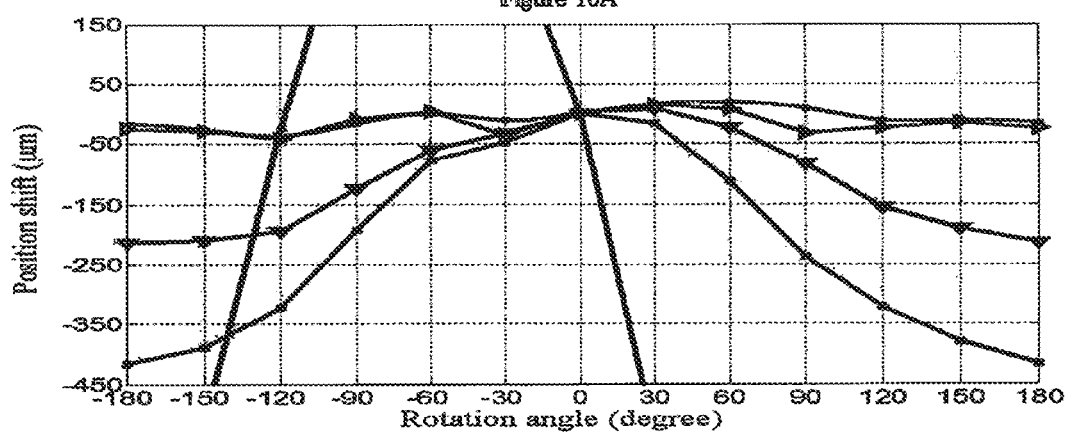
FIG. 10B is a graph showing an enlarged portion of FIG. 10A.
Figure 10C:
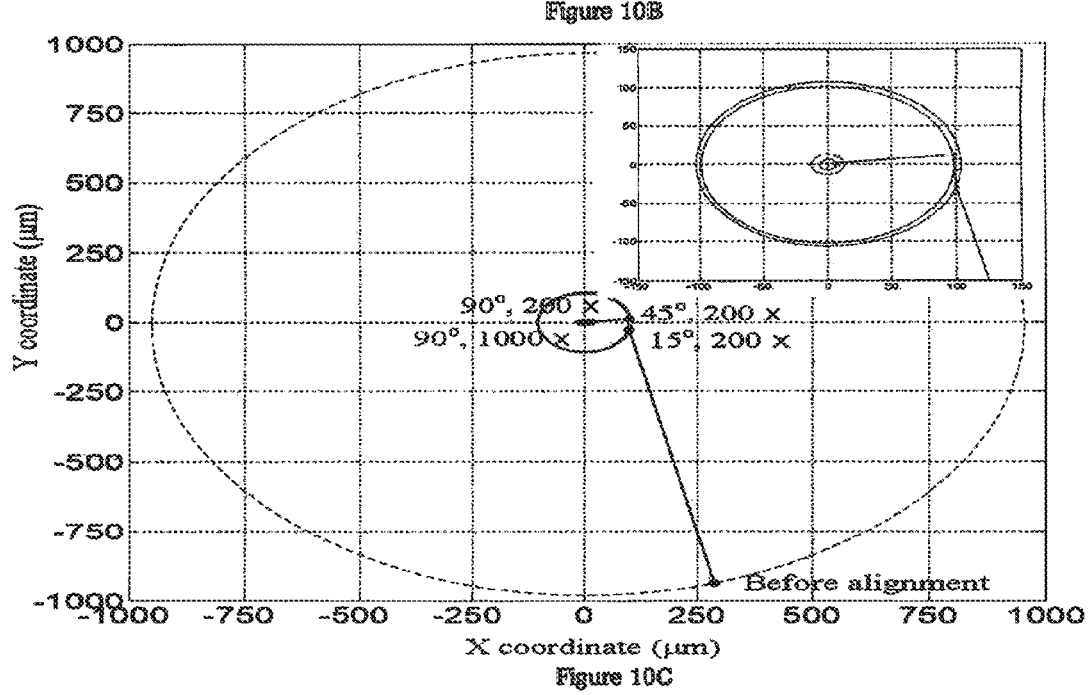
FIG. 10C is a graph showing a trajectory of a to-be-aligned point of the object in each alignment step of FIG. 10A.

Table IV shows the values of $S_{M360}$ and $S_{DM360}$ in all the above alignment process, and FIGS. 10A and 10B (enlarged part of FIG. 10A) show graphs of the position shift against different rotation angles for different alignment steps. The results indicate that the initial value of the maximum position shift $S_{M360}$ is 2142 μm. After four steps of alignment, this value has been gradually reduced to 416 μm, 221 μm, 57 μm and 56.5 μm. Meanwhile, the standard deviation $S_{DM360}$ has also been reduced from 781 μm to 155 μm, 85 μm, 19 μm, and finally to 16.6 μm after the four steps of alignment. In addition, the coordinate of the to-be-aligned point in {N} is also calculated based on the experimental data, and the trajectory of the sample after each alignment is shown in FIG. 10C. It can be seen from FIG. 10C that the alignment is highly efficient as the shift can be readily reduced to near zero just using a few alignment steps.

TABLE IV

STANDARD DEVIATION ($SD_{M360}$), AND MAXIMUM POSITION SHIFT ($S_{M360}$) AT DIFFERENT ALIGNMENT STEP IN ONE COMPLETE AUTOMATIC ALIGNMENT

| Step | Description | $SD_{M360}$ (μm) | $SD_{M360}$'s improvement | $S_{M360}$ (μm) | $S_{M360}$'s improvement |
|---|---|---|---|---|---|
| 1 | Initial | 781 | | 2142 | |
| 2 | 15° at 200× | 155 | 80.2% | 416 | 80.5% |
| 3 | 45° at 200× | 85 | 45.3% | 221 | 46.8% |
| 4 | 90° at 200× | 19 | 78.1% | 57 | 74.2% |
| 5 | 90° at 1000× | 16.6 | 10.4% | 56.5 | 1.1% |

Although the alignment at the end of the fourth step still has some errors, the alignment is sufficiently accurate to ensure that the sample object is kept within the field of view of the microscope during rotation. In other words, the alignment error is acceptable for full-orientation microscopic applications.

The above results verify that the proposed three-loop alignment strategy as shown in the embodiment of FIG. 8 can obtain a reasonable alignment quality in 360° by using only three images. It also shows that this approach is able to align the sample under the microscope with high efficiency as only three images are required in each alignment step.

In the embodiment of the present invention, the alignment algorithm is implemented based on the selected to-be-aligned point. As a result, the algorithm can be applied to samples with different shape or structures, while still achieving the same effects. To verify this, the alignment of a watch hand with asymmetric structure is demonstrated in FIG. 11.

Figure 11:
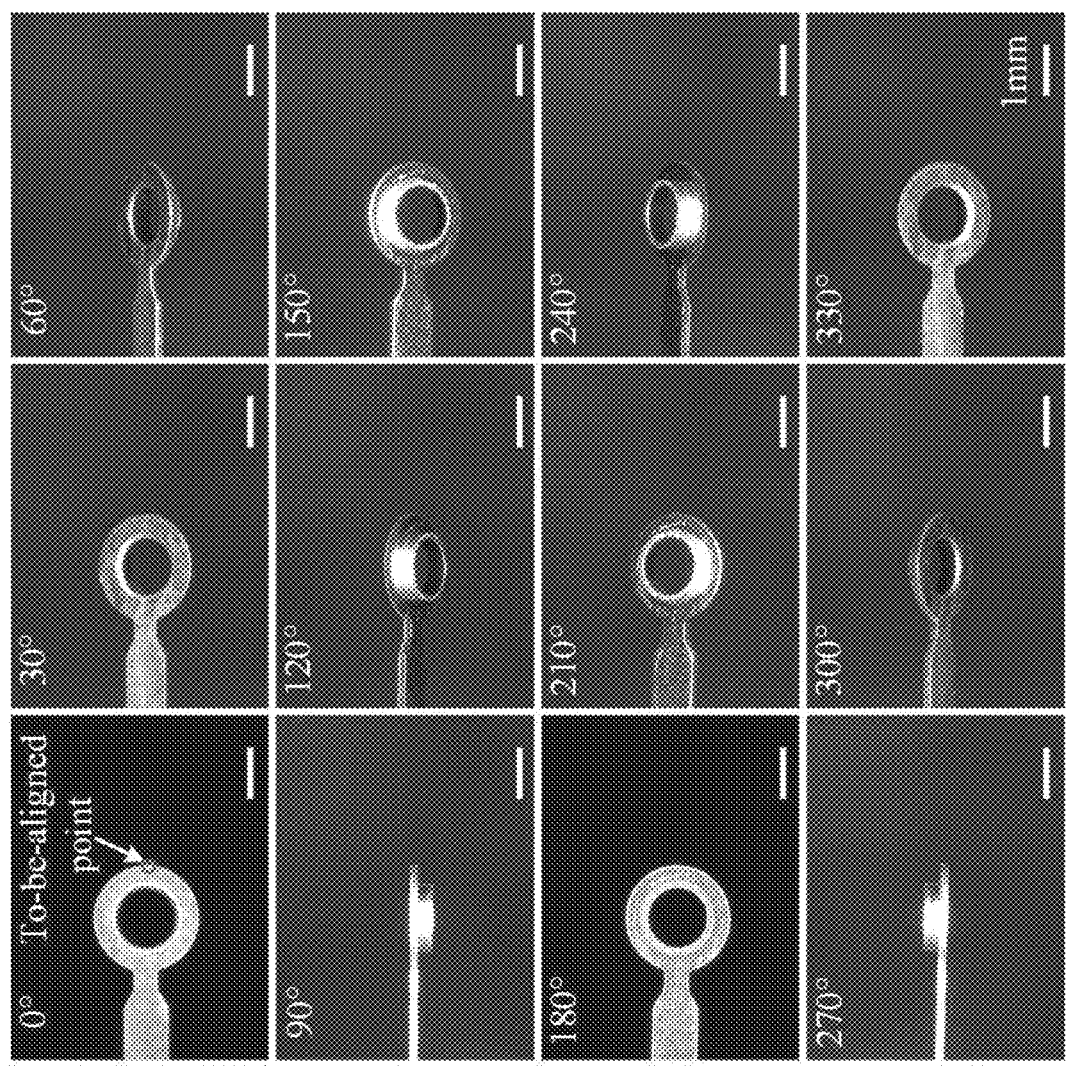
FIG. 11 is a series of images of an asymmetric watch hand observed from different orientations under microscopy after alignment.

In the demonstration of FIG. 11, the rightmost point of the watch hand is chosen to be the to-be-aligned point. Then, the alignment is implemented following the same process as shown in the embodiment of FIG. 8. After that, the image of the watch hand is taken every 30° within one revolution (360°) at magnification M=100. Pictures of these images are shown in FIG. 11. The maximum position shift ($S_{M_{360}}$) and the stand deviation ($S_{DM_{360}}$) for the twelve images in FIG. 11 are 89 μm and 27 μm respectively. Comparing with the size of the watch hand, the above error is negligible. This shows that the proposed alignment strategy in FIG. 8 is also effective for asymmetric object.

The system and method for aligning an object for imaging in the embodiments of the present invention are advantageous in that they can automatically align the sample object to the rotation axis of the system, and as a result, the observation of the sample from full-orientation under microscopes becomes possible. This is particularly important in view of the significant challenge for imaging a small sample from multi directions under microscopes because it would difficult to keep the object within the field of view of the microscope during rotation movement.

The method for aligning an object for imaging in the embodiments of the present invention can be performed with a minimum of three microscopic images. As a result, the method can be implemented easily with a simple experimental procedure and is highly efficiency. Three loops, i.e., position shift loop, angle loop, and magnification loop, are used in the alignment strategy of the embodiments of the present invention to gradually increase the alignment accuracy. As the results show, the sample can be kept in the center region of the field of view of the microscope during the full-orientation imaging.

The method for aligning an object for imaging in the embodiments of the present invention is based on a to-be-aligned target point. Therefore, the implementation of this method is independent of the structure of the sample, and can work equally well for samples with symmetric or asymmetric geometries.

The method for aligning an object for imaging in the embodiments of the present invention is significant in many aspects at small scale. It does not enable full-orientation imaging under microscope, but also provides possibilities for other basic studies at small scale, such as micro defect detection, micro characterization and so on. Exemplary applications include detection of the defect of the object in micro- or nano-scale under microscope from different directions, in-situ characterization of different regions of the micro- or nano-sized sample from different orientations, studying of mechanical properties of the tube-like sample, such as nanowire, carbon fiber, optical fiber, under torsion load, and so on.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A method for manipulating an object for imaging by an imaging device, comprising the steps of:
    (a) rotating the object about a rotation axis into a plurality of angular positions comprising a first angular position, a second angular position and a third angular position;
    (b) capturing an image of the object at each of the plurality of angular positions;
    (c) determining a respective translation required of the object for the plurality of angular positions, the translation being along a plane substantially orthogonal to the rotation axis; the respective translation being arranged to align the object to the rotation axis so as to maintain the object within a field of view of the imaging device, the determination step comprises:
    mapping a position of the object in an object space to a position of the object on the image in an image space; and
    determining a translation required of the object in the object space based on a position difference of the object in the images in the image space; and
    (d) comparing the position difference with an error threshold $\epsilon_{mag}$ to determine if translation determined would be sufficient to move the object into an optimized position.

2. The method in accordance with claim 1, wherein the rotation axis is substantially perpendicular to an imaging axis of the imaging device, and the plane is substantially parallel to the imaging axis of the imaging device.

3. The method in accordance with claim 1, an angular separation between the first and second angular positions is the same as an angular separation between the second and third angular positions.

4. The method in accordance with claim 1, wherein the error threshold $\epsilon_{mag}$ is defined by $$\varepsilon_{mag} = \frac{u}{Ra}TP$$

wherein u is a dimension of a pixel in the image space; Ra is an indicator of a fluctuation tolerance of the object in the field of view of the imaging device; and TP is a height of the image measured in the image space.

5. The method in accordance with claim 1, whereupon determining that the position difference is larger than the error threshold $\epsilon_{mag}$: translating the object to a new position based on the determined translation; and repeating steps (a) to (c) for the same angular separation with the object translated to the new position.

6. The method in accordance with claim 1, whereupon determining that the position difference is smaller than the error threshold $\epsilon_{mag}$:
    a. repeating steps (a) to (c) for one or more further angular separations.

7. The method in accordance with claim 6, wherein the angular separation is smaller than the one or more further angular separations.

8. The method in accordance with claim 6, wherein the angular separation and the one or more further angular separations are each less than 90 degrees.

9. The method in accordance with claim 6, further comprising:
   adjusting a magnification of the imaging device to a second value after repeating steps (a) to (c) for the one or more further angular separations.

10. The method in accordance with claim 9, wherein the second value of the magnification equals to a working magnification of the imaging device.

11. The method in accordance with claim 1, further comprising:
    adjusting a magnification of the imaging device to a first value prior to step (a).

12. The method in accordance with claim 11, wherein the first value is smaller than a working magnification of the imaging device.

13. The method in accordance with claim 1, further comprising the step of:
    (e) imaging the object at different angular positions by rotating and translating the object based on the determined translation at the plurality of angular positions.

14. The method in accordance with claim 13, wherein the object is rotated about the rotation axis in step (e) for at least one revolution so as to obtain a plurality of images of the object at different angular positions.

15. The method in accordance with claim 13, wherein the object is rotated continuously about the rotation axis in step (e).

16. The method in accordance with claim 13, wherein the translation and rotation of the object are independent.

17. The method in accordance with claim 13, wherein the imaging of the object in step (e) is performed under a working magnification of the imaging device.

18. The method in accordance with claim 1, wherein the object includes one or more micro- or nano-structures to be imaged by the imaging device.

19. The method in accordance with claim 1, further comprising the step of: measuring rotational properties of the object as the object is being rotated and translated based on the determined translation at each of the different angular positions.

20. The method in accordance with claim 1, wherein the imaging device is an optical microscope or an electron microscope.

21. A system for manipulating an object for imaging by an imaging device, comprising:
    a translation and rotation assembly arranged to rotate the object about a rotation axis and to translate the object along a plane substantially orthogonal to the rotation axis;
    a controller arranged to control the translation and rotation assembly and to control operation of an imaging device;
    wherein the controller is arranged to operate the translation and rotation assembly and the imaging device to perform the method in accordance with claim 1.

22. The system in accordance with claim 21, wherein the rotation axis is substantially perpendicular to an imaging axis of the imaging device, and the plane is substantially parallel to the imaging axis of the imaging device.

23. The system in accordance with claim 21, wherein the imaging device is an optical microscope or an electron microscope.

24. The system in accordance with claim 21, wherein the translation and rotation assembly has three or more degree of freedom.

25. The system in accordance with claim 21, wherein the translation and rotation assembly comprises a translation module and a rotation module that can be operated independently.

26. A method for manipulating an object for imaging by an imaging device comprising the steps of:
    (a) rotating the object about a rotation axis into a plurality of angular positions comprising a first angular position, a second angular position, and a third angular position;
    (b) capturing an image of the object at each of the plurality of angular positions;
    (c) determining a respective translation required of the object for the plurality of angular positions, the translation being along a plane substantially orthogonal to the rotation axis; the respective translation being arranged to align the object to the rotation axis so as to maintain the object within a field of view of the imaging device, the determination step comprising:
    mapping a position of the object in an object space to a position of the object on the image in an image space; and
    determining a translation required of the object in the object space based on a position difference of the object in the images in the image space; wherein the position of the object in the object space $[X_N, Y_N, Z_N]^T$ is mapped to the position of the object on the image in the image space $[X_M, Y_M, Z_M]^T$ based on:

$$\begin{bmatrix} x_M \\ y_M \\ z_M \end{bmatrix} = \frac{1}{u} RX(\theta_x) \cdot RY(\theta_y) \cdot RZ(\theta_z) \begin{bmatrix} x_N \\ y_N \\ z_N \end{bmatrix} + T_{MN}$$

wherein $$T_{MN} = \begin{bmatrix} x_T \\ y_T \\ z_T \end{bmatrix}, RX(\theta_x) = \begin{bmatrix} 1 & 0 & 0 \\ 0 & \cos\theta_x & \sin\theta_x \\ 0 & -\sin\theta_x & \cos\theta_x \end{bmatrix},$$

$$RY(\theta_y) = \begin{bmatrix} \cos\theta_y & 0 & -\sin\theta_y \\ 0 & 1 & 0 \\ \sin\theta_y & 0 & \cos\theta_y \end{bmatrix}, RZ(\theta_z) = \begin{bmatrix} \cos\theta_z & \sin\theta_z & 0 \\ -\sin\theta_z & \cos\theta_z & 0 \\ 0 & 0 & 1 \end{bmatrix},$$

$\theta_x$, $\theta_y$, and $\theta_z$ are a rotation angle of the object space relative to the image space about rotation axes $X_M$, $Y_M$ and $Z_M$ in the image space respectively; $[X_T, Y_T, Z_T]^T$ is a translation between the object space and the image space, and u is a dimension of a pixel in the image.

27. A method for manipulating an object for imaging by an imaging device comprising the steps of:
    (a) rotating the object about a rotation axis into a plurality of angular positions comprising a first angular position, a second angular position, and a third angular position;
    (b) capturing an image of the object at each of the plurality of angular positions;
    (c) determining a respective translation required of the object for the plurality of angular positions, the translation being along a plane substantially orthogonal to the rotation axis; the respective translation being arranged to align the object to the rotation axis so as to maintain the object within a field of view of the imaging device, the determination step comprising:

mapping a position of the object in an object space to a position of the object on the image in an image space; and determining a translation required of the object in the object space based on a position difference of the object in the images in the image space; wherein the translation required of the object for a particular angular separation is determined based on:

$$\begin{bmatrix} x_{n0} \\ y_{n0} \\ z_{n0} \end{bmatrix} = u \begin{bmatrix} \dfrac{\Delta x_f + \Delta x_b}{2\cos\alpha - 2} \\ \dfrac{\Delta x_f - \Delta x_b}{2\sin\alpha} \\ \dfrac{1}{u} z_{n0} \end{bmatrix}$$

wherein $[X_{n0}, Y_{n0}, Z_{n0}]^T$ is a coordinate of a to-be-aligned point of the object in object space; $\mu$ is a dimension of a pixel in the image space, $\Delta x_f$ is a position difference of the object in the image of the first angular position and in the image of the second angular position; $\Delta x_b$ is a position difference of the object in the image of the second angular position and the object in the image of the third angular position; and $\alpha$ is an angular separation between the first and second angular positions.

* * * * *